United States Patent [19]

Lawton

[11] Patent Number: 4,589,667
[45] Date of Patent: May 20, 1986

[54] VACUUM COMPATIBLE COLLETING SPINDLE

[75] Inventor: Robert J. Lawton, Boise, Id.

[73] Assignee: Hewlett-Packard Company, Palo Alto, Calif.

[21] Appl. No.: 661,544

[22] Filed: Oct. 16, 1984

[51] Int. Cl.$^4$ .......................................... B23B 31/40
[52] U.S. Cl. .................................. 279/2 A; 118/500; 118/503; 279/2 R; 279/106
[58] Field of Search ................ 409/232; 118/500, 503; 279/1 B, 1 T, 1 TE, 6, 2 R, 2 A, 106, 35; 242/72 R

[56] References Cited

U.S. PATENT DOCUMENTS

| | | | |
|---|---|---|---|
| 2,852,262 | 9/1958 | Parker et al. | 279/2 A |
| 2,920,894 | 1/1960 | Kreinick | 279/6 |
| 3,191,924 | 6/1965 | Haus | 279/106 |
| 3,371,650 | 3/1968 | Böhler | 118/503 |
| 3,522,014 | 7/1970 | Keller | 279/6 |
| 4,002,141 | 1/1977 | Shrader | 118/500 |
| 4,108,107 | 8/1978 | Scheuermann | 118/500 |
| 4,314,524 | 2/1982 | Deguchi | 118/503 X |
| 4,485,759 | 12/1984 | Brandolf | 118/503 |

FOREIGN PATENT DOCUMENTS

766762 10/1980 U.S.S.R. ............................. 279/2 R

Primary Examiner—William R. Briggs
Attorney, Agent, or Firm—Leslie G. Murray

[57] ABSTRACT

Apparatus is provided in which a colleting and spindle assembly for lifting and rotating a substrate mounting chassis within a high vacuum sputtering chamber is mounted. Lifting and clamping action is accomplished utilizing rolling contact between surfaces produced by rotating a minor shaft with an eccentrically mounted bearing within and relative to a major shaft. A pneumatically-actuated piston mounted on one end of the major shaft drives an internally mounted high helix screw which is prevented from rotating relative to the major shaft thereby producing linear motion of the helix screw in a helix nut resulting in rotational motion of the helix nut relative to the major shaft. The rotational motion of the helix nut is coupled to the minor shaft causing it to rotate relative to the major shaft. Once the spindle assembly has been coupled to the substrate mounting chassis, the major shaft couples rotational motion to the substrate mounting chassis from outside the chamber to inside the chamber.

3 Claims, 7 Drawing Figures

FIG 3D ated piston for independently and reciprocally moving the magnet in a vertical direction with respect to the main assembly. When the magnet and substance holder are coupled, actuation of the main piston lifts the--

VACUUM COMPATIBLE COLLETING SPINDLE

BACKGROUND AND SUMMARY OF THE INVENTION

The present invention pertains to colleting devices, and in particular, to a spindle having means operative thereof for releasably engaging the inner surface of a workpiece and rotating the workpiece thus engaged in vacuum deposition environments.

The use of cam-like devices to engage and lock a workpiece to a rotating shaft is well known. Once such device comprises a cylindrical plug, keyed in place to prevent independent rotation, sliding within a hole bored through a sleeve. The plug has a conical head which rides within a counterbore in one end of the sleeve. The largest diameter of the conical head is slightly less than the diameter of the counterbore. Four pins slide freely within four equally-spaced holes drilled radially through the walls of the sleeve into the counterbore. A clevis pin is threaded through the center of the plug and extends the length of the sleeve. An operating lever with a forked end fits over and is coupled to the clevis pin and bears against the end of the sleeve with smaller diameter bore. A cam-like curvature is formed at the connecting end of the lever with the cam radius gradually increasing through ninety degrees of rotation.

To lock the sleeve within the bearing hole in a workpiece, the operating lever is pivoted through ninety degrees. This action draws the conical head of the plug into the counterbore and into contact with the four pins extending radially through the wall of the sleeve. As the plug is drawn into the counterbore, the pins are forced radially outward and into a receiving groove in the bearing surface of the workpiece thereby locking the workpiece to the sleeve.

U.S. Pat. No 4,398,733, issued to Thomas C. Mosley, Jr., on May 13, 1981, discloses a jawed lathe chuck having means selectively operative for engaging either the outer surface of a workpiece or the inner surface of a workpiece. The chuck comprises a hub rotatably journalled in a jaw carrier, and the latter rotatable journalled in a body. The carrier pivotably mounts a plurality of jaws having camming surfaces, and drive pins upstanding from the hub and body slideably engage the camming surfaces to move the jaws outwardly, to engage the inner surface of a workpiece, or inwardly, to engage the outer surface of a workpiece. A screw carried in the jaw carrier is movable into the hub, to lock the hub and jaw carrier together, and movable into the body, to lock the body and the jaw carrier together to prevent relative rotation between the hub and the jaw carrier or between the jaw carrier and the body.

U.S. Pat. No. issued to Robert L. Shrader on Jan. 11, 1977, discloses an assembly for lifting a substrate holder from its carrier platform and rotating the holder in a vacuum chamber during a substrate coating process. The assembly comprises essentially a main assembly that is reciprocally movable in a vertical direction by an actuating piston and a sub-assembly that is embodied in and movable with the main assembly. The sub-assembly comprises a permanent magnet and a second or auxiliary actuating piston for independently and reciprocally moving the magnet in a vertical direction with respect to the main assembly. When the magnet and substance holder are coupled, actuation of the main piston lifts the entire assembly together with the substrate holder, clear of the carrier platform.

For rotating the coupled magnet and holder during the coating process, the magnet which is independently rotatable within the assembly about its vertical axis, is connected by a spring belt transmission to exterior motive means through a suitable seal in the coating chamber wall.

A principle concern in high vacuum, elevated temperature, thick or thin film deposition systems is to minimize the sources of particles within the deposition chambers which contaminate the deposition process itself. Typically, a major source of particles result from actuation or frictional engagement of metal parts. Further, in the production of certain deposited-film parts, such as disc memory media, magnetic contamination cannot be tolerated.

In accordance with the present invention, a high vacuum sputtering chamber is provided with a horizontal spindle housing or the like, in which a colleting and spindle assembly for lifting and rotating a substrate mounting chassis is mounted. Lifting and clamping action is accomplished utilizing rolling contact between surfaces produced by rotating a minor shaft with an eccentrically mounted bearing within and relative to a major shaft. As the minor shaft rotates relative to the major shaft, the distance between the major shaft centerline and the eccentric bearing centerline is varied.

The apparatus in accordance with the present invention comprises a plunger shaft mounted within and coaxial to a spindle shaft. The plunger shaft inclues a bearing eccentrically mounted on one end of the shaft protruding from the plunger shaft beyond the spindle tip. The spindle shaft is rotationally mounted horizontally in the spindle housing with the spindle tip protruding into the vacuum chamber through a bellows assembly fixably attached to the exterior of the vacuum chamber. The spindle shaft is reciprocally movable transversely to the chamber wall by a first pneumatically-actuated piston for releasably engaging a hub in the center of the substrate mounting chassis. A second pneumatically-actuated piston mounted on the rear end of the spindle shaft drives an internally mounted high helix screw which is prevented from rotating relative to the spindle shaft causing a high helix nut to rotate relative to the spindle shaft. The rotational motion of the helix nut is coupled to the plunger shaft causing it to rotate relative to the spindle shaft.

To rotate the substrate mounting chassis within the vacuum chamber, the spindle tip is first inserted in the substrate mounting chassis hub by activation of the first piston. Activation of the second piston causes the plunger shaft to rotate bringing the eccentric bearing into contact with the inner surface of the hub. Further rotation of the plunger shaft lifts the substrate mounting chassis free of a chassis transport platform. Because the plunger shaft centerline is also eccentric to the spindle shaft centerline further rotation of the plunger shaft positions the chassis such that the hub horizontal axis is coincident with the spindle centerline. The chassis is locked in this position by the clamping action resulting from contact by the inner surface of the chassis hub with a locating pad protruding from the spindle tip. The spindle shaft now acts as a drive shaft to impart rotational motion to the chassis provided by an external source.

DESCRIPTION OF THE PREFERRED EMBODIMENT

The present invention is illustrated as applied to a vacuum deposition apparatus wherein substrate coating takes place in a high vacuum, elevated temperature environment. In the vacuum chamber a chassis transport platform moves a substrate mounting chassis into position in the chamber where the chassis is lifted from the platform and rotated during substrate coating. To describe the invention, it will be sufficient to show only a portion of the chamber wall and the chassis hub.

Figure 1A:
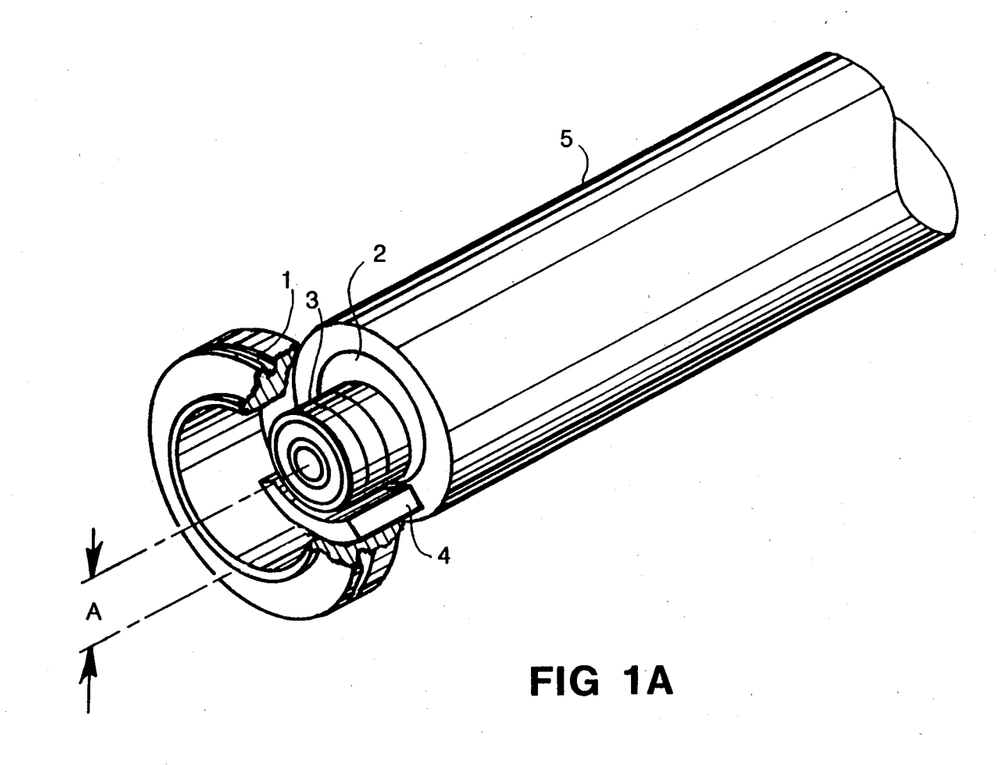
FIGS. 1a and 1b are perspective views of the colleting assembly illustrating the principles of the present invention.
Figure 1B:
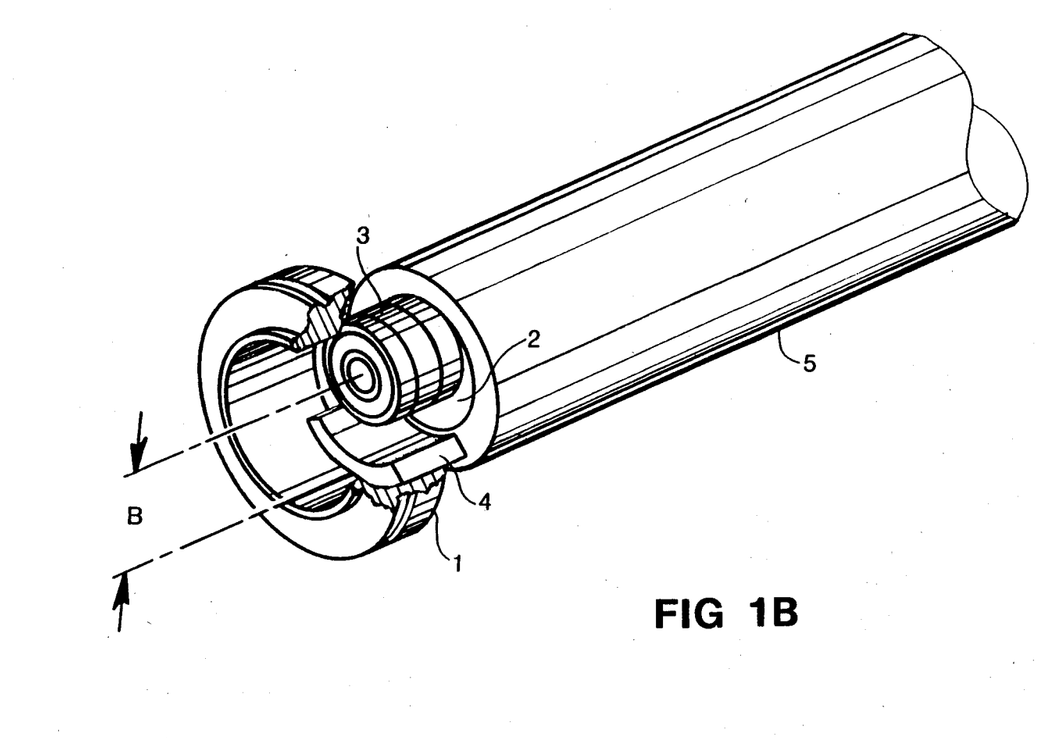

Referring now to FIGS. 1a and 1b, the colleting or spindle tip assembly comprises spindle shaft extension 5 with locator pad 4 protruding from a portion of the periphery of the face of the tip of the spindle shaft extension 5 and plunger shaft 2 with an eccentrically mounted bearing 3 protruding from the end of the plunger shaft 2. The plunger shaft 2 is rotationally mounted within the spindle shaft extension 5 such that the plunger shaft's centerline is eccentric to the centerline of the spindle shaft extension. Rotation of the plunger shaft 2 relative to the spindle shaft extension 5 varies the separation between the center of the eccentric bearing 3 and the outside surface of the locator pad 4 from a minimum distance "a" to a maximum distance "b".

The spindle tip assembly is disposed in a horizontal plane. The plunger shaft 2 is first rotated to the orientation that minimizes the distance between the eccentric bearing 3 centerline and the outer surface of the locator pad 4, distance "a" as shown is FIG. 1a. The spindle tip assembly is then rotated so that the locator pads 4 face down.

Thus orientated, the spindle tip assembly is inserted in the substrate mounting chassis hub 1. After the spindle tip is inserted in the chassis hub 1, the plunger shaft 2 is rotated relative to the spindle extension shaft 5 bringing the eccentric bearing into rolling contact with the inner surface of the chassis hub 1. This action lifts the substrate mounting chassis (not shown) clear of the transport platform (not shown) and clamps the chassis hub 1 to the spindle tip assembly. The eccentric bearing 3 is prevented from rotating over center as the inner surface of the chassis hub 1 contacts the locating pad 4 and prevents any further rotation of the plunger shaft 2. The spindle tip assembly is then rotated during the coating process. At the completion of the processing, the spindle tip assembly rotation is stopped in the same orientation as when the spindle tip was when inserted in the chassis hub 1. The plunger shaft 2 is then rotated in the opposite direction as it was rotated for hub engagement, releasing the chassis hub 1 and positioning the substrate mounting chassis (not shown) back onto the transport platform (not shown).

The preferred embodiment of the present invention is shown in detail in FIGS. 2, 3a, 3b, 3c and 3d. Referring now to FIGS. 2, 3a, 3b, 3c and 3d, the eccentric bearing 3 comprises bearing shield 3b, bearings 3c and 3d and mounted on plunger shaft extension 3e by screw 3a. The plunger shaft 2 is eccentrically and rotationally mounted within spindle shaft extension 5 through bearings 21a and bearing separator 21b. The spindle shaft extension 5 passes through the vacuum chamber bulkhead 25 and is coupled to spindle shaft 7. Pulley 31 and pneumatic actuator mounting collar 9 are fixably attached to the other end of the spindle shaft 7. The pneumatic actuator comprises actuator body 10, spring 28, piston 13, vave body 14, air union 22 and air fittings 24 and 35. The actuator body 10 includes two internal bores in which the piston guide rods 11 are slideably mounted; the piston guide rods 11 also prevent rotation of the piston 13 relative to the spindle shaft 7. Extension rod 12 couples piston 13 to high helix screw 27; a flat sided slot in the end of extension rod 12 fits over the end of the helix screw 27 such that linear movement of piston 13 results in linear movement of helix screw 27. Helix screw 27 is inserted in helix nut 29 such that linear movement of helix screw 27 causes rotational motion of the helix nut 29 relative to the spindle shaft 7. Helix nut 29 is rigidly coupled to the plunger shaft 2 by bushing 30, ferrofluidic feed through shaft 8 and coupler 6.

The spindle shaft assembly includes a rotary vacuum seal of the ferrofluidic type (ferrofluidic seals are commercially available from the Ferrofluidics Corporation under the trade name Ferrofluidic TM seals) for mounting the spindle shaft 7. Rotary vacuum seal 34 is mounted on carriage plate 19. The carriage plate 19 is slideably mounted on shafts 15 by ball bushings 16 and coupled to the front plate 18 by bellows 26. The spindle housing comprises front plate 18, shafts 15 and rear plate 20, and is fixedly attached to the vacuum chamber wall 25 at front plate 18.

A stepper motor 17 also mounted on carriage plate 19 by motor mount 23 is coupled to the spindle shaft 7 by pulleys 33 and 31 via belt 32. The spindle assembly is movably transversely to the chamber wall 25 by actuation of a pneumatically-operated piston (not shown) coupled to the carriage plate 19.

Figure 2:
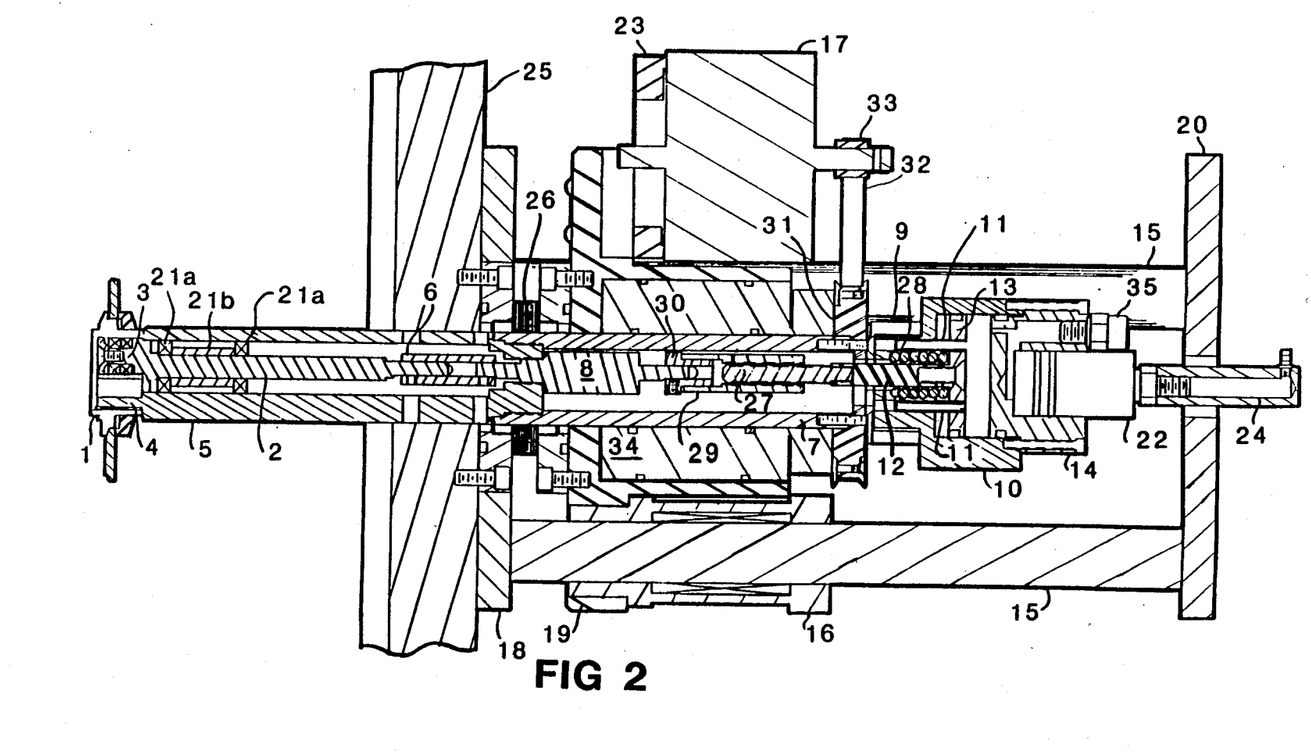
FIG. 2 is a side section view of the colleting and spindle assembly in accordance with the present invention.
Figure 3A:
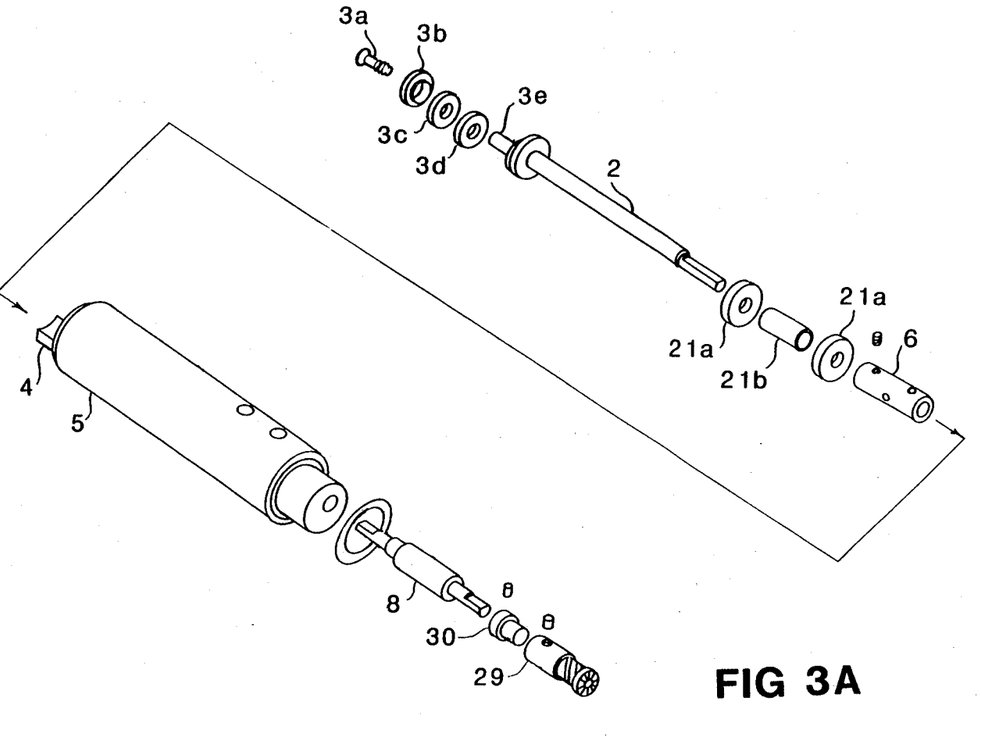
FIGS. 3a, 3b, 3c and 3d are an exploded view of the colleting and spindle assembly illustrated in FIG. 2.
Figure 3B:
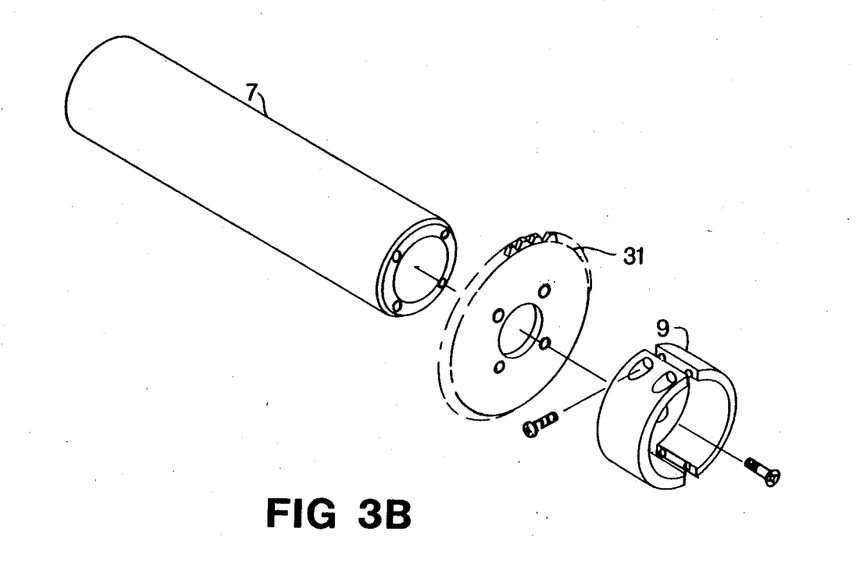
Figure 3C:
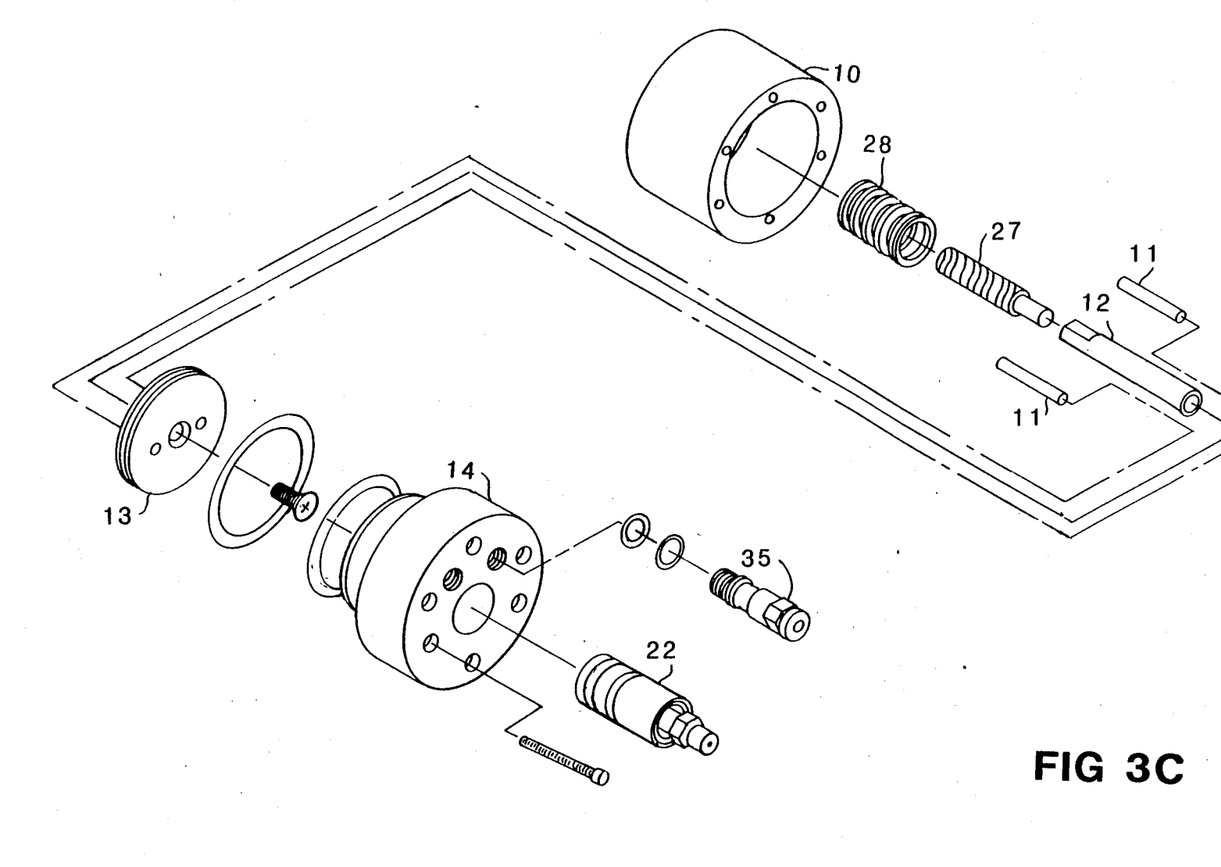
Figure 3D:
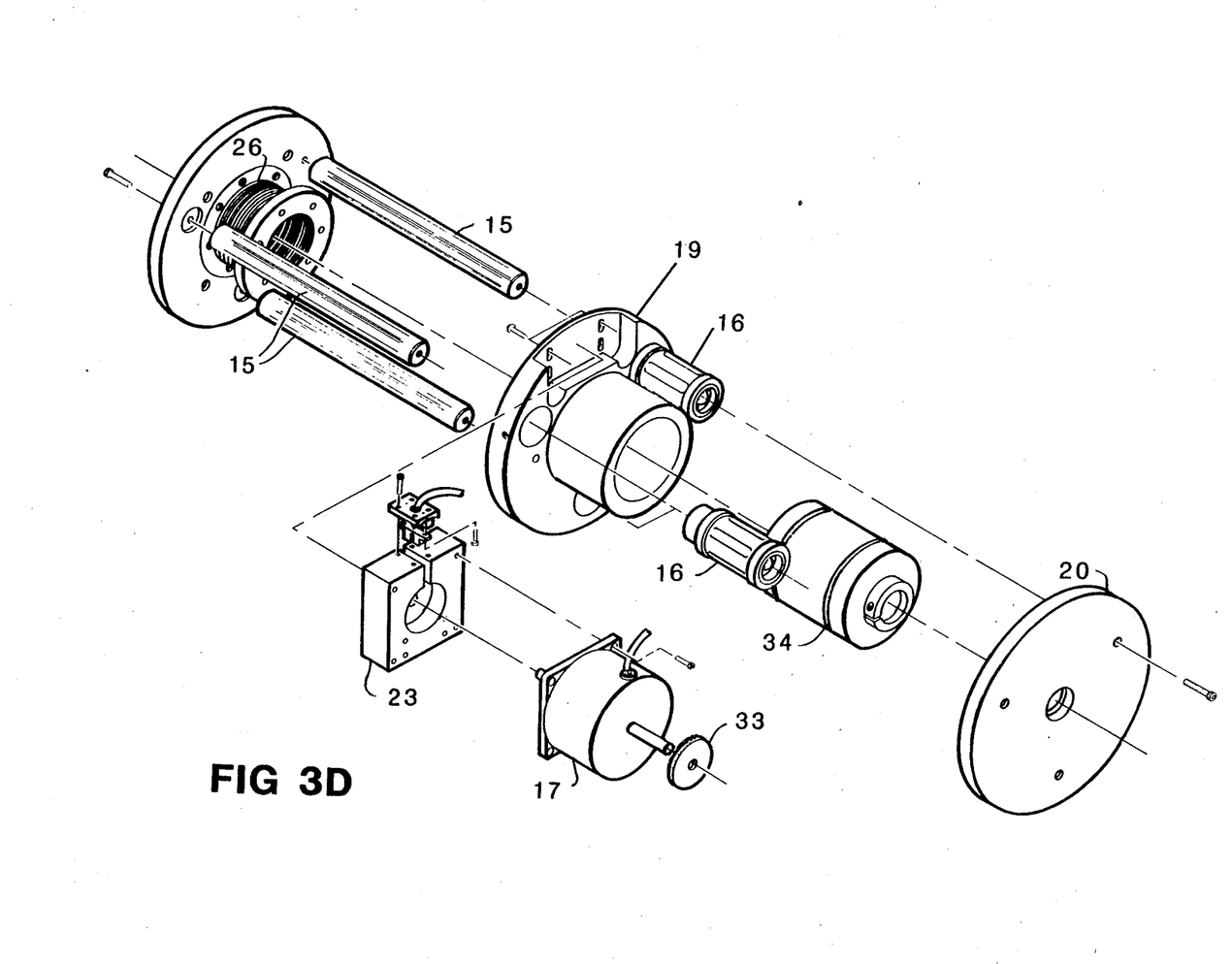

Referring now to FIG. 2, during operation the spindle tip assembly is first inserted in the chassis hub 1 by actuation of the pneumatic piston (not shown) coupled to carriage plate 19. Proper orientation of the locator pads 4 is assured by operating stepper motor 17 only in 200 nr increments (where n is a positive integer and r is the pulley ratio). Compressed air is then admitted to valve body 14 forcing piston 13 to move towards the spindle shaft 7 and compress spring 28. Piston guide rods 11 prevent rotational motion of the piston and hence movement of the piston results in linear motion of the helix screw 27. Linear motion of helix screw 27 within helix nut 29 results in rotational motion of helix nut 29 relative to the spindle shaft 7. Rotational motion of helix nut 29 results in rotational motion of plunger shaft 2 relative to spindle shaft extension 5 to provide the required lifting and clamping action to engage chassis hub 1. Plunger shaft 2 is coupled to the helix nut 29 via ferrofluidic feed through shaft 8 to maintain the vacuum during rotation of the plunger shaft 2. Once the chassis hub 1 is engaged, rotational motion is coupled to the substrate mounting chassis (not shown) from the stepper motor 17 via pulleys 31 and 33 and belt 32. Rotary vacuum seal 34 provides a liquid barrier to vacuum while permitting rotation of spindle shaft 7. Bellows 26 at the axial end of the spindle assembly housing provide vacuum seal while allowing the spindle tip assembly the linear motion necessary to insert or withdraw from chassis hub 1. At the completion of the substrate processing, rotation of the chassis (not shown) is stopped and the pressure relieved from piston 13. Compressed spring 28 then expands moving helix screw 27 in the opposite direction causing plunger shaft 2 to rotate thereby releasing chassis hub 1.

What is claimed:

1. Apparatus for releasably engaging and coupling rotational motion to a chassis in a vacuum deposition chamber, said apparatus comprising:

a major shaft transversely slideably and rotationally mounted through a vertical wall of said vacuum chamber for releasably engaging and coupling rotational motion to said chassis from outside the chamber to inside the chamber, said major shaft including a bore parallel to the major shaft's major axis extending the length of the major shaft and a protruding rim along a portion of the periphery of a first end of the major shaft, said first end disposed within said chamber;

a minor shaft disposed within said bore of the major shaft, said minor shaft including an eccentrically-mounted bearing at one end, said eccentrically-mounted bearing extending from said first end of the major shaft, the centerline of said minor shaft displaced from the centerline of said major shaft such that rotation of the minor shaft relative to the major shaft causes the distance between the centerline of the eccentrically-mounted bearing and the centerline of the major shaft to vary from a minimum distance to a maximum distance; and rotational means fixedly attached to a second end of the major shaft, said rotational means coupled to the minor shaft for rotating said minor shaft relative to the major shaft.

2. Apparatus as in claim 1 wherein said major shaft comprises:

a spindle shaft extension including said first end of the major shaft and a coupling end, said spindle shaft extension having the minor shaft disposed within; and a spindle shaft coupled to said coupling end of the spindle shaft extension and including said second end of the major shaft, said rotational means fixedly attached to and extending into said spindle shaft.

3. The apparatus of claim 2 wherein said rotational means comprises:

piston means including a pair of piston guide pins and a piston rod, the piston rod fixedly attached to the center of the piston and extending perpendicular to said piston, said guide pins for guiding and preventing rotation of said piston means relative to the spindle shaft;

a valve body including a base with a central bore and a pair of guide bores, said valve body base fixedly attached to said second end of the spindle shaft, said guide bores for receiving said piston guide pins, said piston rod extending through said central bore into the spindle shaft;

a high helix screw disposed within the spindle shaft rigidly coupled to said piston rod such that linear motion of the piston means produces linear motion of the helix screw;

a helix nut rotational mounted within the spindle shaft for receiving said helix screw, linear motion of said helix screw imparting rotational motion to said helix nut;

coupling means disposed within said spindle shaft coupled to said helix nut and to said minor shaft, for coupling rotational motion of said helix nut to said minor shaft.

* * * * *

UNITED STATES PATENT AND TRADEMARK OFFICE
CERTIFICATE OF CORRECTION

PATENT NO. : 4,589,667

DATED : May 20, 1986

INVENTOR(S) : Robert J. Lawton

It is certified that error appears in the above-identified patent and that said Letters Patent is hereby corrected as shown below:

Column 1, line 56 of the Patent, after "U.S. Pat. No." insert --4,002,141--.

Signed and Sealed this

Twenty-first Day of April, 1987

Attest:

DONALD J. QUIGG

Attesting Officer

Commissioner of Patents and Trademarks